US012744073B2

(12) United States Patent
Hatakeyama

(10) Patent No.: US 12,744,073 B2
(45) Date of Patent: Sep. 22, 2026

(54) SEMICONDUCTOR MEMORY DEVICE PERFORMING REFRESH OPERATION USING MULTIPLE DELAY CIRCUITS

(71) Applicant: MICRON TECHNOLOGY, INC., Boise, ID (US)

(72) Inventor: Atsushi Hatakeyama, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 18/635,364

(22) Filed: Apr. 15, 2024

(65) Prior Publication Data

US 2024/0386935 A1 Nov. 21, 2024

Related U.S. Application Data

(60) Provisional application No. 63/503,025, filed on May 18, 2023.

(51) Int. Cl.
*G11C 11/406* (2006.01)
*G11C 11/4076* (2006.01)

(52) U.S. Cl.
CPC .. *G11C 11/40618* (2013.01); *G11C 11/40615* (2013.01); *G11C 11/4076* (2013.01)

(58) Field of Classification Search
CPC ........ G11C 11/40618; G11C 11/40615; G11C 11/4076
See application file for complete search history.

(56) References Cited

U.S. PATENT DOCUMENTS 7,348,821 B2 * 3/2008 Xu ........................ H03K 5/133 327/263
2010/0013528 A1 * 1/2010 Uematsu .............. G11C 11/406 327/142
2022/0352880 A1 * 11/2022 Chen ...................... H03K 19/20

* cited by examiner

*Primary Examiner* — Sultana Begum
(74) *Attorney, Agent, or Firm* — Dorsey & Whitney LLP

(57) ABSTRACT

An example apparatus includes a plurality of pairs of input and output signal lines, a plurality of first delay circuits operatively connected between the plurality of input signal lines and the plurality of output signal lines, and a first selector circuit configured to connect a selected one of the plurality of first delay circuits between a selected one of the plurality of pairs of the input and output signal lines.

16 Claims, 12 Drawing Sheets

SEMICONDUCTOR MEMORY DEVICE PERFORMING REFRESH OPERATION USING MULTIPLE DELAY CIRCUITS

CROSS-REFERENCE TO RELATED APPLICATION(S)

This application claims priority to U.S. Provisional Application No. 63/503,025, filed May 18, 2023. The aforementioned application is incorporated herein by reference, in its entirety, for any purpose.

BACKGROUND

A DRAM (Dynamic Random Access Memory) as a typical semiconductor device may include a plurality of memory banks capable of operating concurrently with one another. When a refresh operation is performed on each memory bank, the operation timing of the refresh operation is adjusted using a timing adjustment circuit. However, since a timing adjustment circuit requires a relatively large occupied area, when the timing adjustment circuit is allocated to each memory bank, it will cause an increase in chip area. Accordingly, there is a demand for a technology to reduce the area occupied by the timing adjustment circuit.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
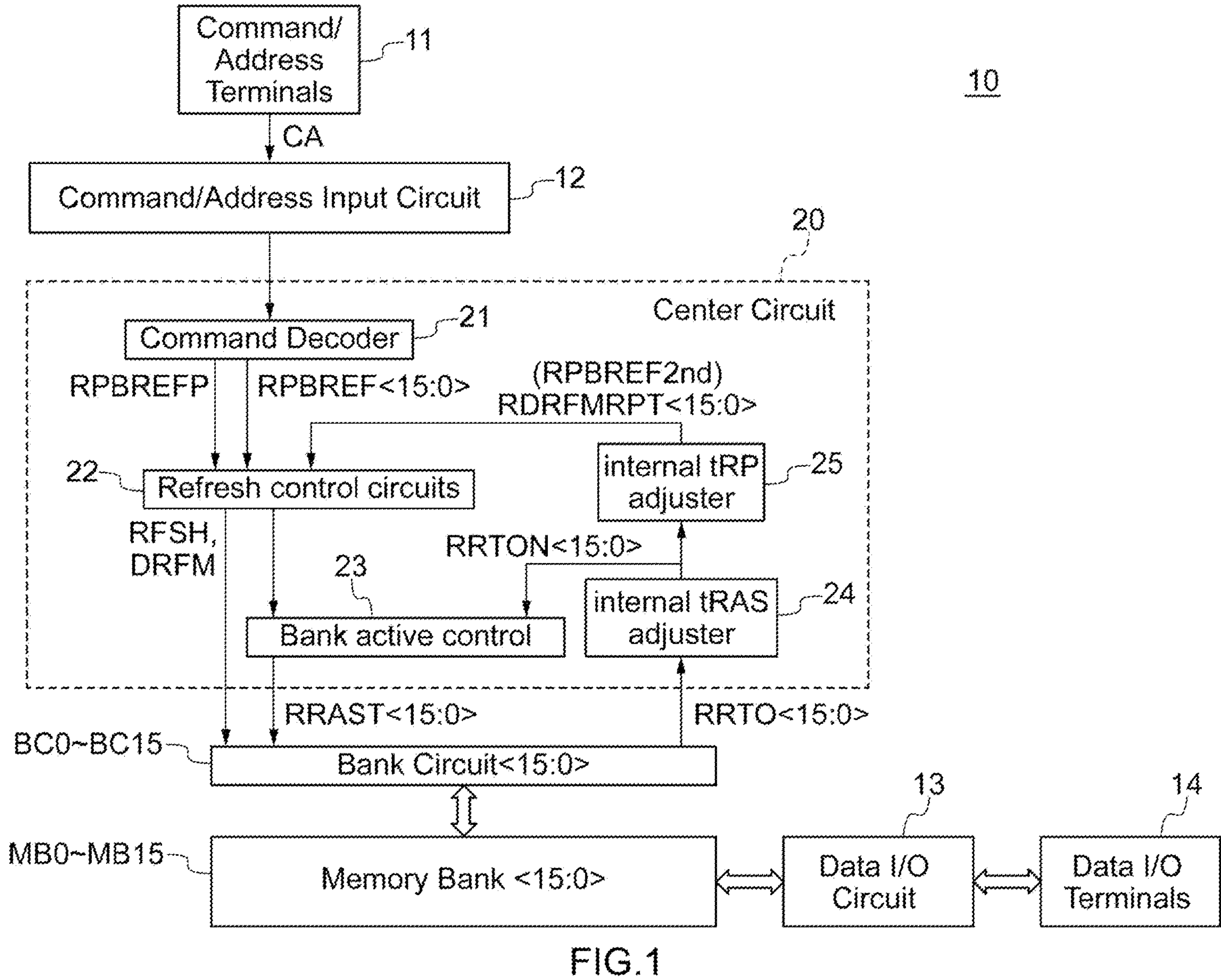
FIG. 1 is a block diagram showing a configuration of a semiconductor memory device according to an embodiment of the present disclosure.

FIG. 1 is a block diagram showing a configuration of a semiconductor memory device 10 according to an embodiment of the present disclosure. The semiconductor memory device 10 shown in FIG. 1 is a DRAM and includes 16 memory banks MB0 to MB15. When access is made to the semiconductor memory device 10, a command/address signal CA is input to a command/address input circuit 12 via a command/address terminal 11. The command/address signal CA is supplied to a center circuit 20 via the command/address input circuit 12. The center circuit 20 is a common peripheral circuit that controls the memory banks MB0 to MB15. For example, when the command/address signal CA indicates a read operation or a write operation, the center circuit 20 controls a selected one of bank circuits BC0 to BC15 based on a bank address, thereby causing an active operation on a selected one of the memory banks MB0 to MB15 to start. With this operation, since any one of the memory banks MB0 to MB15 selected based on a bank address performs an active operation, a word line specified by a row address is activated and a predetermined memory cell is selected. Subsequently, when the command/address signal CA indicates a read operation, read data read from the selected memory cell is output from a data I/O terminal 14 via a data I/O circuit 13. Meanwhile, when the command/address signal CA indicates a write operation, write data input to the data I/O terminal 14 is written into the selected memory cell via the data I/O circuit 13.

Figure 2:
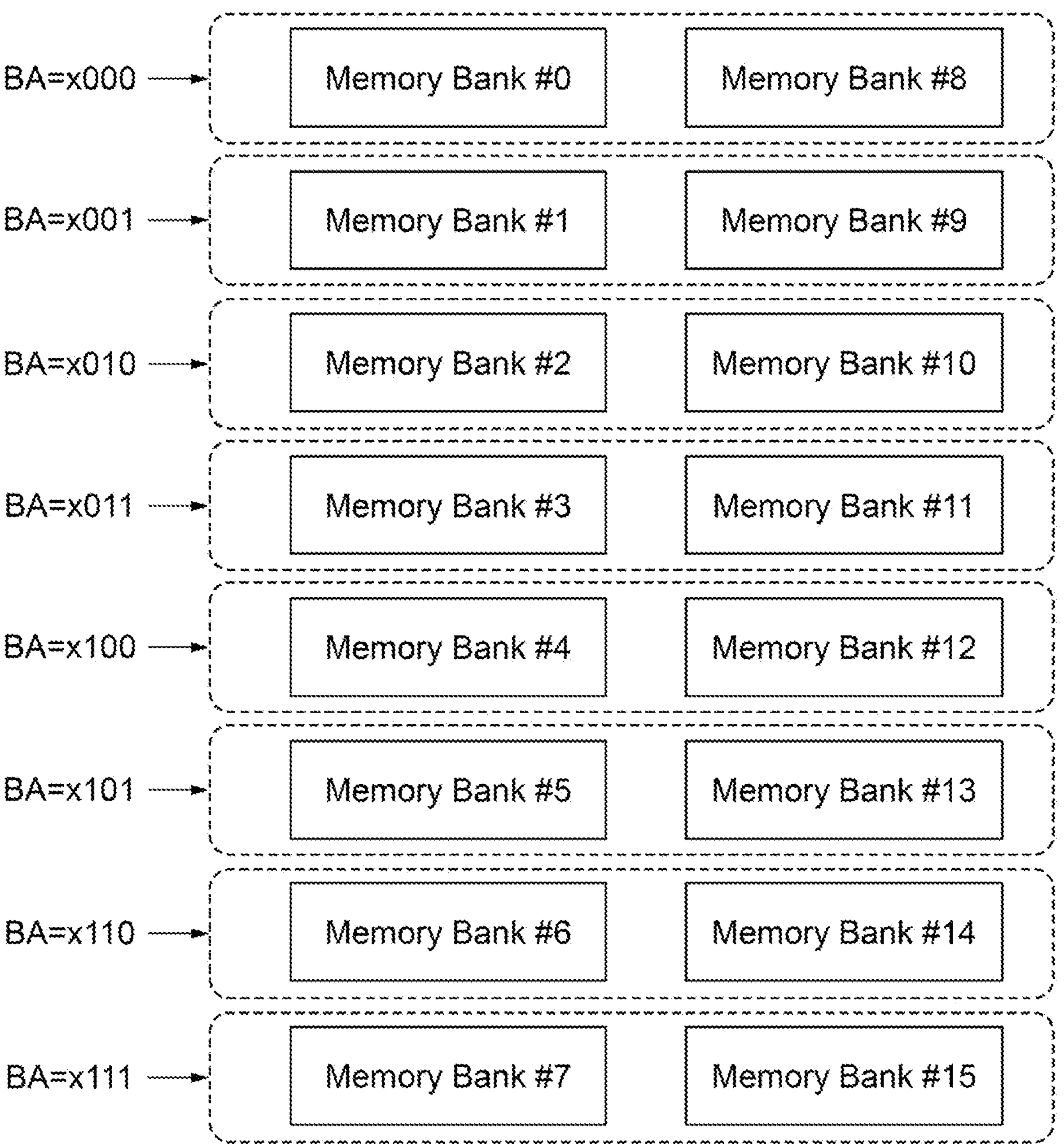
FIG. 2 is a diagram showing examples of relations between a bank address input along with a refresh command and selected memory banks.
Figure 3:
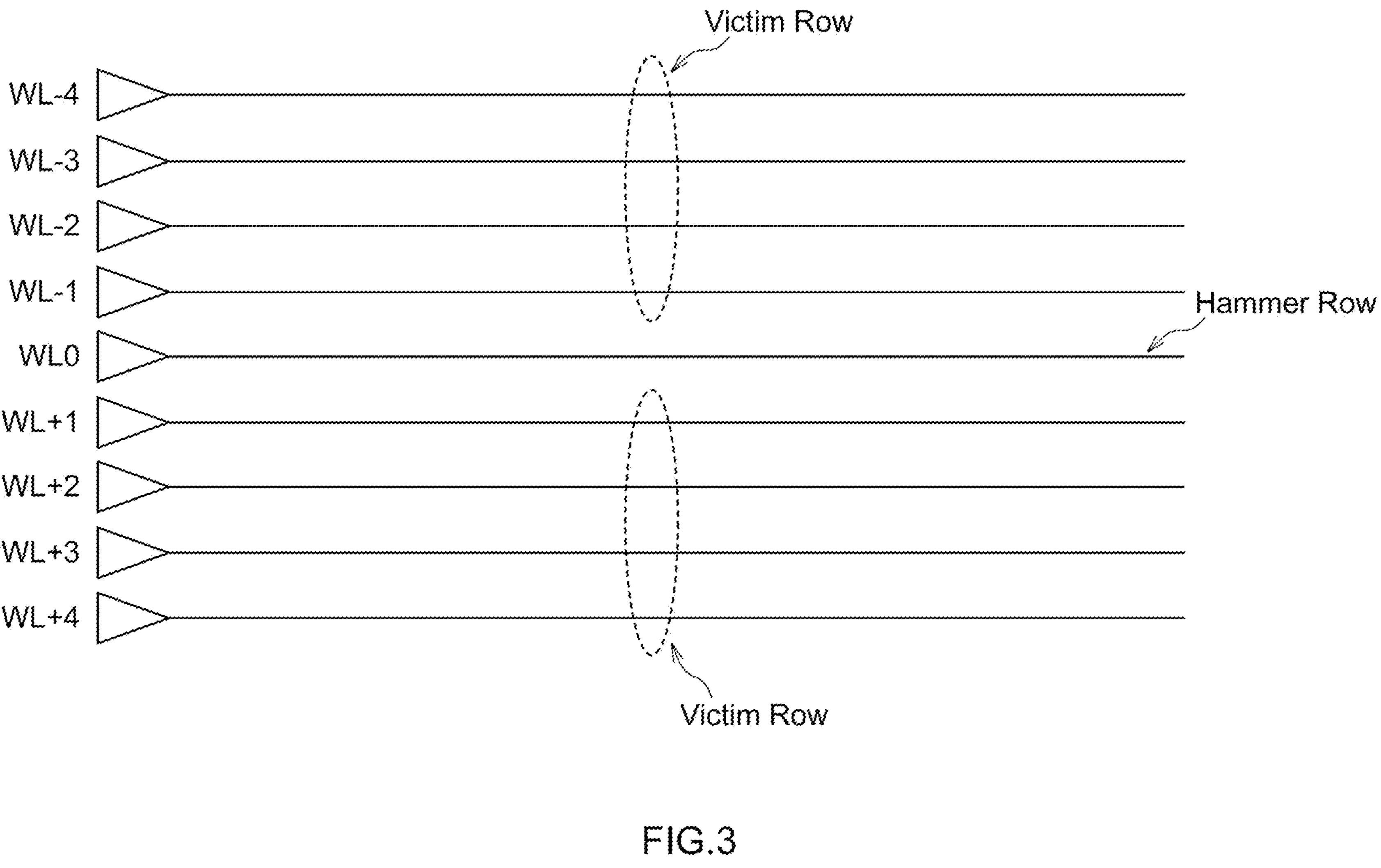
FIG. 3 is an explanatory diagram of positions of word lines selected with a refresh management command.

The center circuit 20 also controls a refresh operation. Commands related to a refresh operation include a refresh command REFpb and a refresh management command DRFMpb. When the refresh command REFpb or the refresh management command DRFMpb is issued, a specified memory bank performs a refresh operation. In this case, a bank address to be input along with the refresh command REFpb has a degenerated one bit, so that two memory banks among the memory banks MB0 to MB15 perform a refresh operation concurrently. FIG. 2 is a diagram showing examples of relations between a bank address BA input along with the refresh command REFpb and memory banks MB0 to MB15 to be selected. In the example shown in FIG. 2, the most significant bit of a bank address BA having a 4-bit configuration is degenerated (x=don't care), and two memory banks are selected concurrently with lower three bits. For example, the memory bank MB0 and the memory bank MB8 are selected concurrently. Meanwhile, when the refresh management command DRFMpb is issued, any one of 16 memory banks MB0 to MB15 is specified. The refresh management command DRFMpb is a command used to avoid a Row Hammer failure by activating word lines adjacent to a word line having many accesses. For example, when accesses are concentrated on a word line WL0 shown in FIG. 3, by issuing the refresh management command DRFMpb, a refresh operation is performed on two word lines WL−1 and WL+1 that are adjacent to the word line WL0. In a refresh management operation, by setting an operation mode, it is possible to perform a refresh operation on two word lines on each side of the word line WL0, that is, on four word lines in total, which are word lines WL−2, WL−1, WL+1, and WL+2. In another operation mode, it is possible to perform a refresh operation on three word lines on each side of the word line WL0, that is, on six word lines in total, which are word lines WL−3, WL−2, WL−1, WL+1, WL+2, and WL+3. In still another operation mode, it is possible to perform a refresh operation on four word lines on each side of the word line WL0, that is, on eight word lines, which are word lines WL−4, WL−3, WL−2, WL−1, WL+1, WL+2, WL+3, and WL+4. Accordingly, when the refresh management command DRFMpb is issued, eight times of refresh operations at maximum are performed successively in a specified memory bank.

Figure 4:
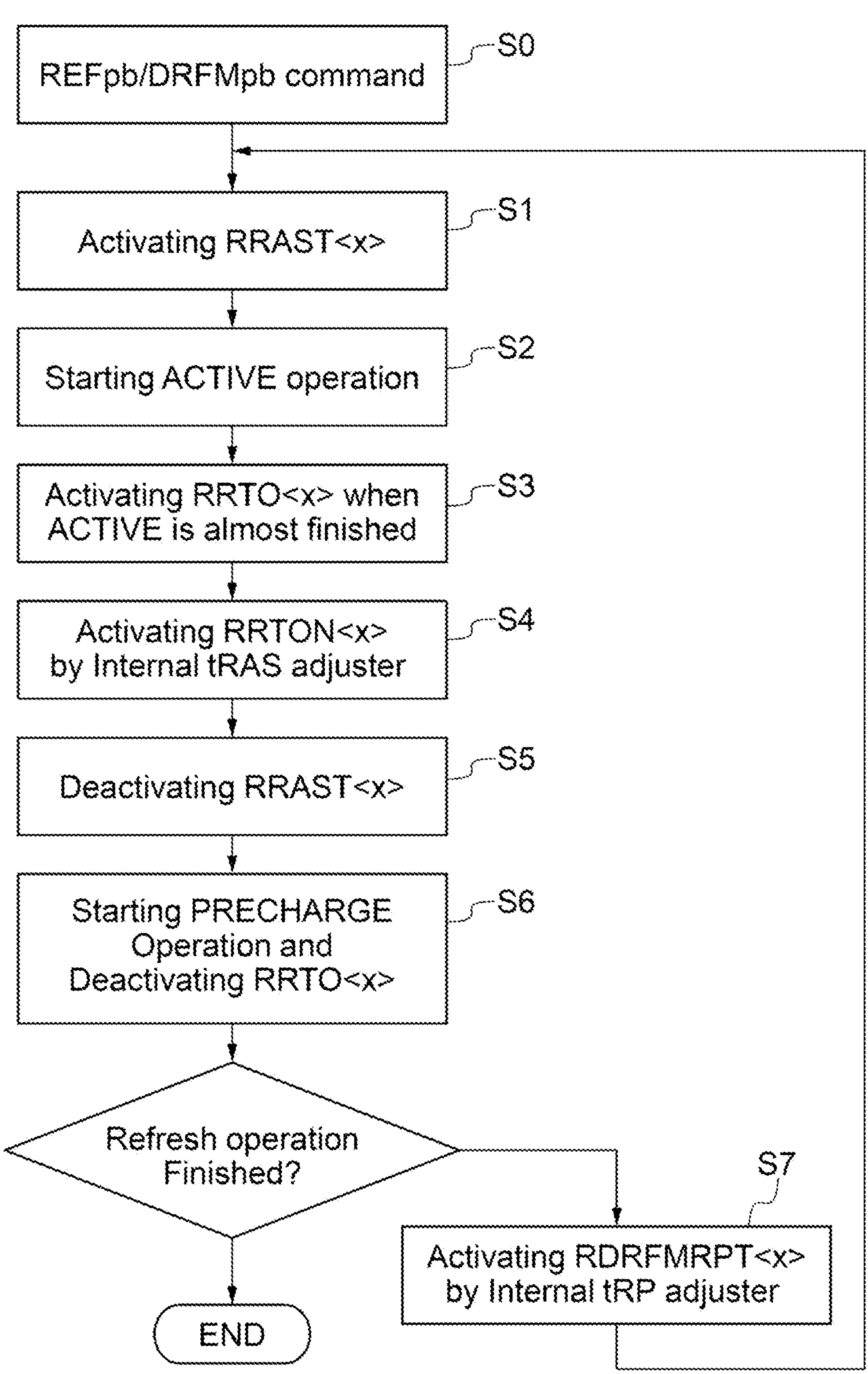
FIG. 4 is a flowchart for explaining an operation of a center circuit when a refresh operation is performed.
Figures 5A, 5B:
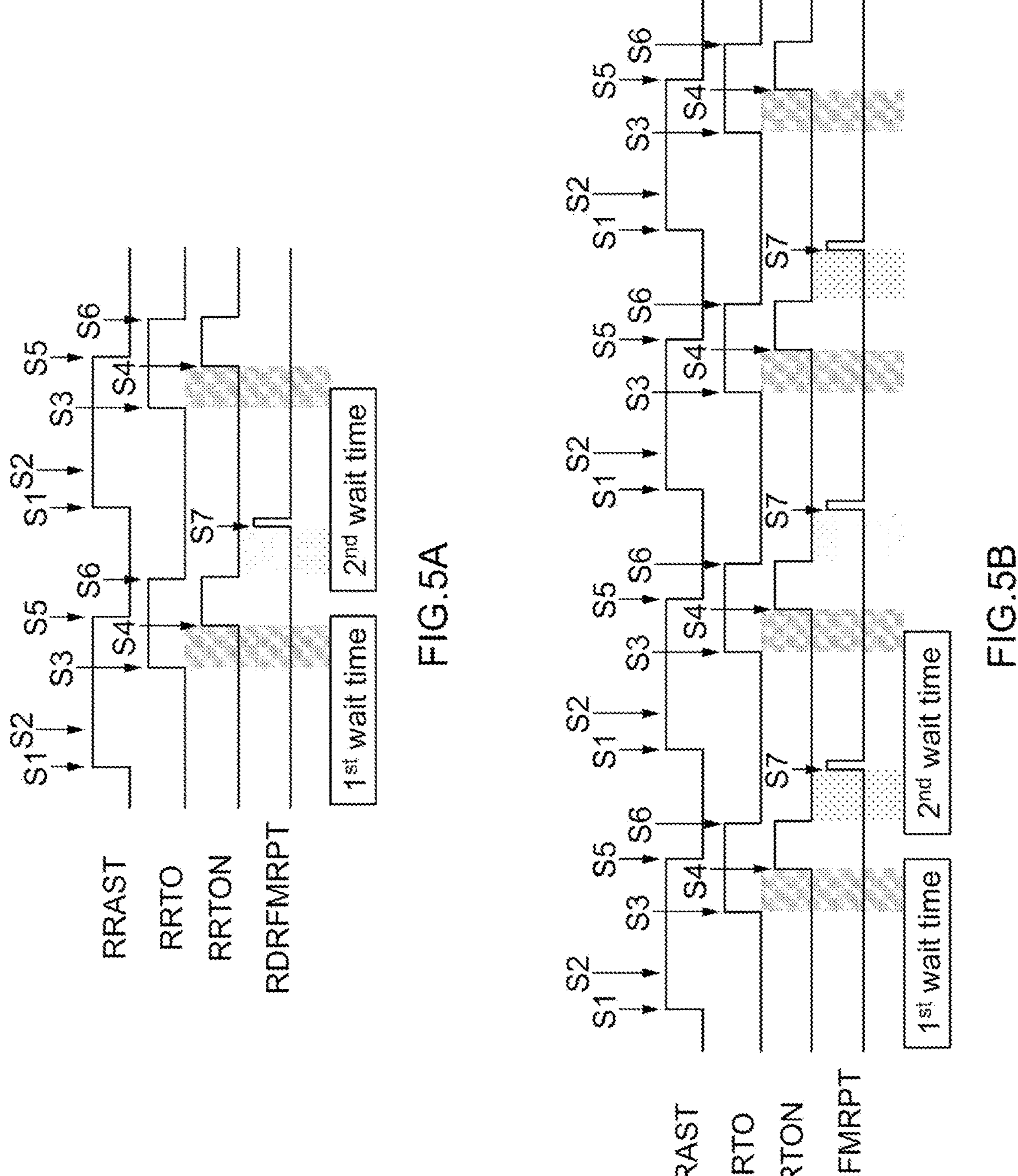
FIGS. 5A and 5B are operation waveform diagrams showing various signal variations when a refresh operation is performed.

FIG. 4 is a flowchart for explaining an operation of the center circuit 20 when a refresh operation is performed. FIGS. 5A and 5B are operation waveform diagrams showing various signal variations when a refresh operation is performed. First, when the refresh command REFpb or the refresh management command DRFMpb is issued from outside (Step S0), an internal signal RPBREFP and an internal address RPBREF<15:0> are activated by a command decoder 21 included in the center circuit 20. The internal address RPBREF<15:0> is a bank address of each of the memory banks MB0 to MB15, which are refresh targets. As described above, when the refresh command REFpb is issued, two memory banks are selected concurrently. The internal signal RPBREFP and the internal address RPBREF<15:0> are supplied to a refresh control circuit 22. The refresh control circuit 22 responds to the internal signal RPBREFP to activate a refresh signal RFSH or a refresh signal DRFM and controls a bank active control circuit 23 to activate an active signal RRAST<15:0> to a high level (Step S1). The refresh signal RFSH is a signal to be activated by responding to the refresh command REFpb. The refresh signal DRFM is a signal to be activated by responding to the refresh management command DRFMpb. The active signal RRAST<15:0> is a bank address of each of the memory banks MB0 to MB15, which are refresh targets and is supplied to bank circuits BC0 to BC15 respectively corresponding to the memory banks MB0 to MB15.

When the active signal RRAST<15:0> is activated, an active operation is started in a selected one of the memory banks MB0 to MB15 (Step S2). With this step, a word line that becomes a refresh target is activated in the selected memory bank. Subsequently, a selected one of the bank circuits BC0 to BC15 activates a corresponding control signal RRTO<15:0> to a high level at a timing right before the active operation is finished (Step S3). The control signal RRTO<15:0> is input to an internal tRAS adjuster 24. The internal tRAS adjuster 24 causes a predetermined amount of delay ($1^{st}$ wait time) to the control signal RRTO<15:0> to generate a control signal RRTON<15:0> (Step S4). The amount of delay caused by the internal tRAS adjuster 24 is adjusted corresponding to the result of operation tests conducted at the time of manufacturing the semiconductor memory device 10. When the control signal RRTON<15:0> is activated, the bank active control circuit 23 deactivates a corresponding active signal RRAST<15:0> to a low level (Step S5). When the active signal RRAST<15:0> is deactivated to a low level, a precharge operation is started in a corresponding one of the memory banks MB0 to MB15 and a corresponding control signal RRTO<15:0> is reset to a low level (Step S6). When the control signal RRTO<15:0> is reset to a low level, a corresponding control signal RRTON<15:0> is also reset to a low level immediately. That is, when the control signal RRTO<15:0> is changed to a low level, any delay similar to delay caused by the internal tRAS adjuster 24 when the control signal RRTO<15:0> is changed to a high level is not generated.

When a series of refresh operations has not been completed, an internal tRP adjuster 25 causes a predetermined amount of delay ($2^{nd}$ wait time) to the corresponding control signal RRTON<15:0> to generate a control signal RDRFMRPT<15:0> (Step S7). The amount of delay caused by the internal tRP adjuster 25 is adjusted according to the result of operation tests conducted at the time of manufacturing the semiconductor memory device 10. When the control signal RDRFMRPT<15:0> is activated, the bank active control circuit 23 performs a refresh operation on another word line by activating the corresponding active signal RRAST<15:0> again. With this step, as shown in FIG. 5A for example, when the refresh command REFpb is issued, a refresh operation is performed sequentially on two word lines included in the same memory bank. Further, as shown in FIG. 5B for example, when the refresh management command DRFMpb is issued, a refresh operation is performed sequentially on four word lines included in the same memory bank. The four word lines to be refreshed in the operation shown in FIG. 5B are the word lines WL−2, WL−1, WL+1, and WL+2 shown in FIG. 3, for example.

Figure 6:
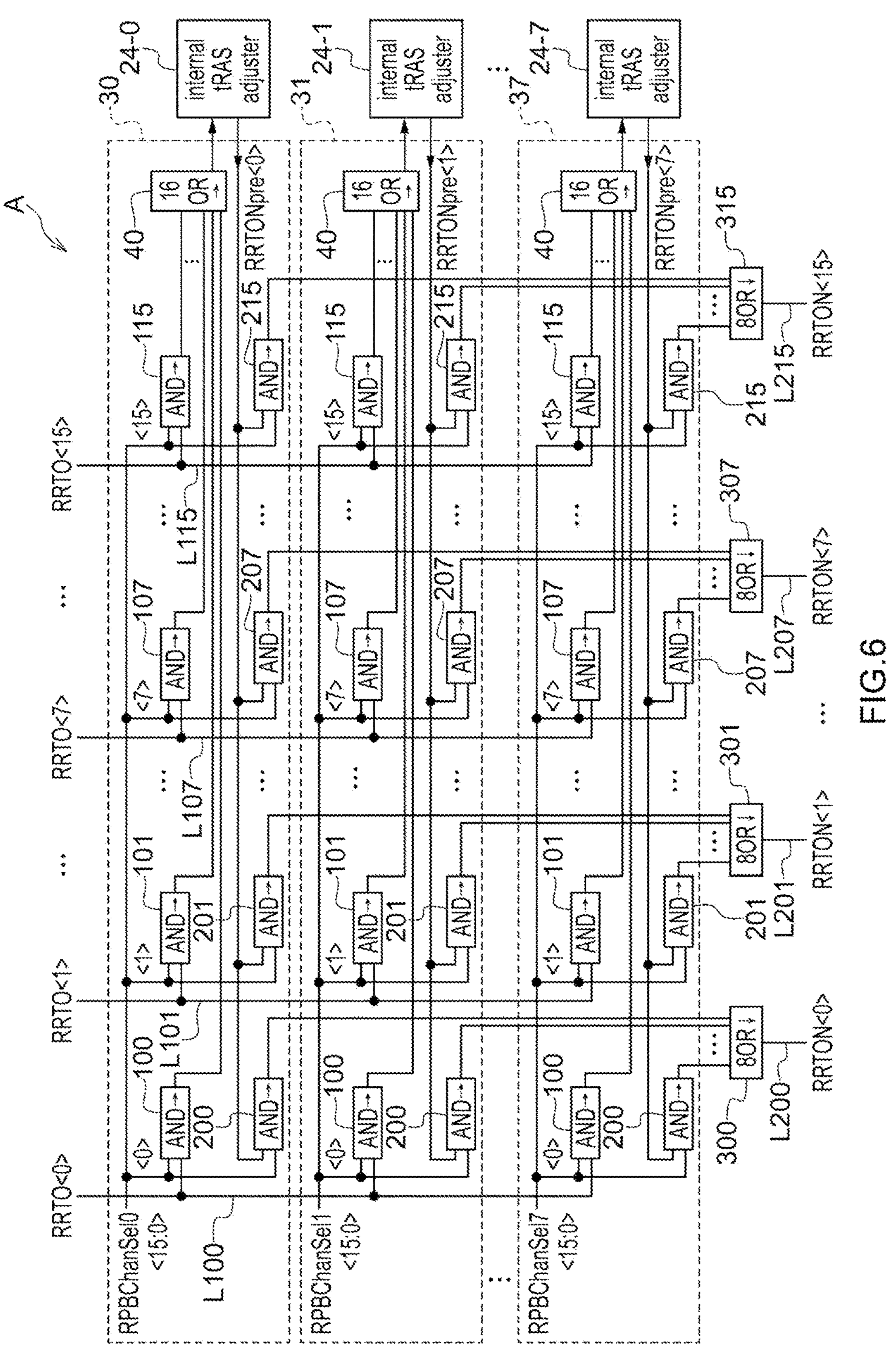
FIG. 6 is a circuit diagram of a distribution circuit connected to an internal tRAS adjuster.

FIG. 6 is a circuit diagram of a distribution circuit A connected to the internal tRAS adjuster 24. As shown in FIG. 6, the distribution circuit A includes eight selector circuits 30 to 37. Each of the selector circuits 30 to 37 has a corresponding one of internal tRAS adjusters 24-0 to 24-7 allocated thereto. That is, in the example shown in FIG. 6, eight internal tRAS adjusters 24-0 to 24-7 are provided. Each of the selector circuits 30 to 37 includes input AND gate circuits 100 to 115, output AND gate circuits 200 to 215, and an OR gate circuit 40. Control signals RRTO<0> to <15> are supplied via input lines L100 to L115 respectively to one of input nodes of each of the input AND gate circuits 100 to 115. This feature is common to all the selector circuits 30 to 37. Selection signals RPBChanSel<i><k> are respectively supplied to the other input node of each of the input AND gate circuits 100 to 115. Here, i is any one of 0 to 7 and the number is different in each of the selector circuits 30 to 37, and k is any one of 0 to 15 and the number corresponds to each of the input AND gate circuits 100 to 115.

Figure 7:
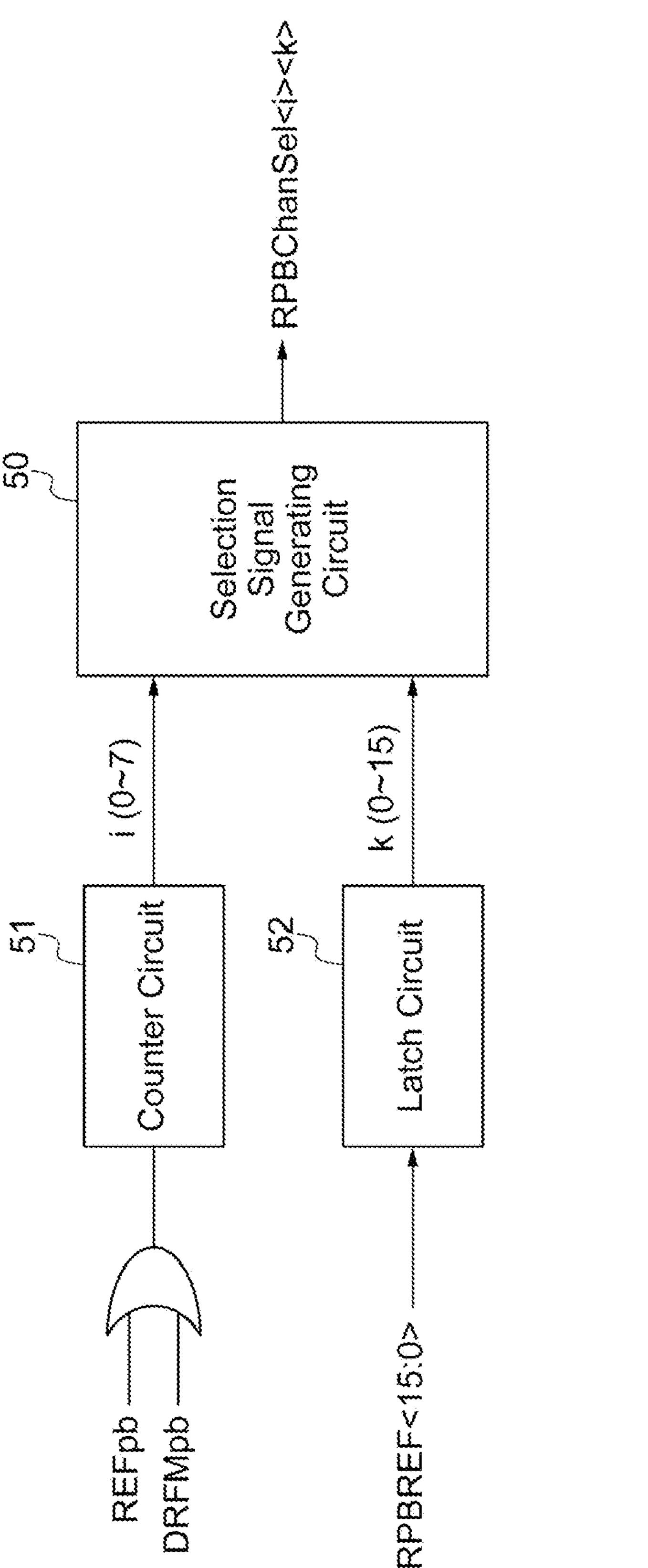
FIG. 7 is a circuit diagram of a selection signal generating circuit.

FIG. 7 is a circuit diagram of a circuit that generates the selection signals RPBChanSel<i><k>. As shown in FIG. 7, the selection signals RPBChanSel<i><k> are generated by a selection signal generating circuit 50. The selection signal generating circuit 50 activates corresponding ones of the selection signals RPBChanSel<i><k> based on a signal i supplied from a counter circuit 51 and a signal k supplied from a latch circuit 52. For example, when the signal i supplied from the counter circuit 51 indicates <0> and the signal k supplied from the latch circuit 52 indicates <1>, the selection signal generating circuit 50 activates a selection signal RPBChanSel<0><1>. The signal i as a count value of the counter circuit 51 is updated each time the refresh command REFpb or the refresh management command DRFMpb is issued. The signal k is a value of the internal address RPBREF<15:0> latched on the latch circuit 52.

Referring back to FIG. 6, output signals from the input AND gate circuits 100 to 115 are supplied to the OR gate circuit 40. That is, the OR gate circuit 40 is an OR circuit of 16-input type, and output signals therefrom are input to corresponding ones of the internal tRAS adjusters 24-0 to 24-7. Accordingly, the control signals RRTO<0> to <15> are input to any one of the eight internal tRAS adjusters 24-0 to 24-7. The relation between the sixteen control signals RRTO<0> to <15> and the eight internal tRAS adjusters 24-0 to 24-7 is dynamically changed according to the value of the signal i as a count value of the counter circuit 51. The internal tRAS adjusters 24-0 to 24-7 respectively provide a predetermined amount of delay to the input control signals RRTO<0> to <15> and output these signals as control signals RRTONpre<0> to <7>.

A control signal RRTONpre<i> is commonly supplied to one of input nodes of each of the output AND gate circuits 200 to 215. Here, i is any one of 0 to 7 and the number is different in each of the selector circuits 30 to 37. The selection signals RPBChanSel<i><k> are respectively supplied to the other input node of each of the output AND gate circuits 200 to 215. Here, i is any one of 0 to 7 and the number is different in each of the selector circuits 30 to 37, and k is any one of 0 to 15 and the number corresponds to each of the output AND gate circuits 200 to 215. An output signal from the output AND gate circuit 200 included in each of the selector circuits 30 to 37 is supplied to an OR gate circuit 300. That is, the OR gate circuit 300 is an OR circuit of 8-input type, and an output signal therefrom is a control signal RRTON<0>. Other OR gate circuits 301 to 315 have the same configuration, and the OR gate circuits 301 to 315 respectively generate control signals RRTON<1> to <15> based on output signals from the output AND gate circuits 201 to 215 respectively corresponding to the OR gate circuits 301 to 315. The control signals RRTON<0> to <15> are supplied to the bank active control circuit 23 shown in FIG. 1 via output lines L200 to L215, respectively.

Figure 8A:
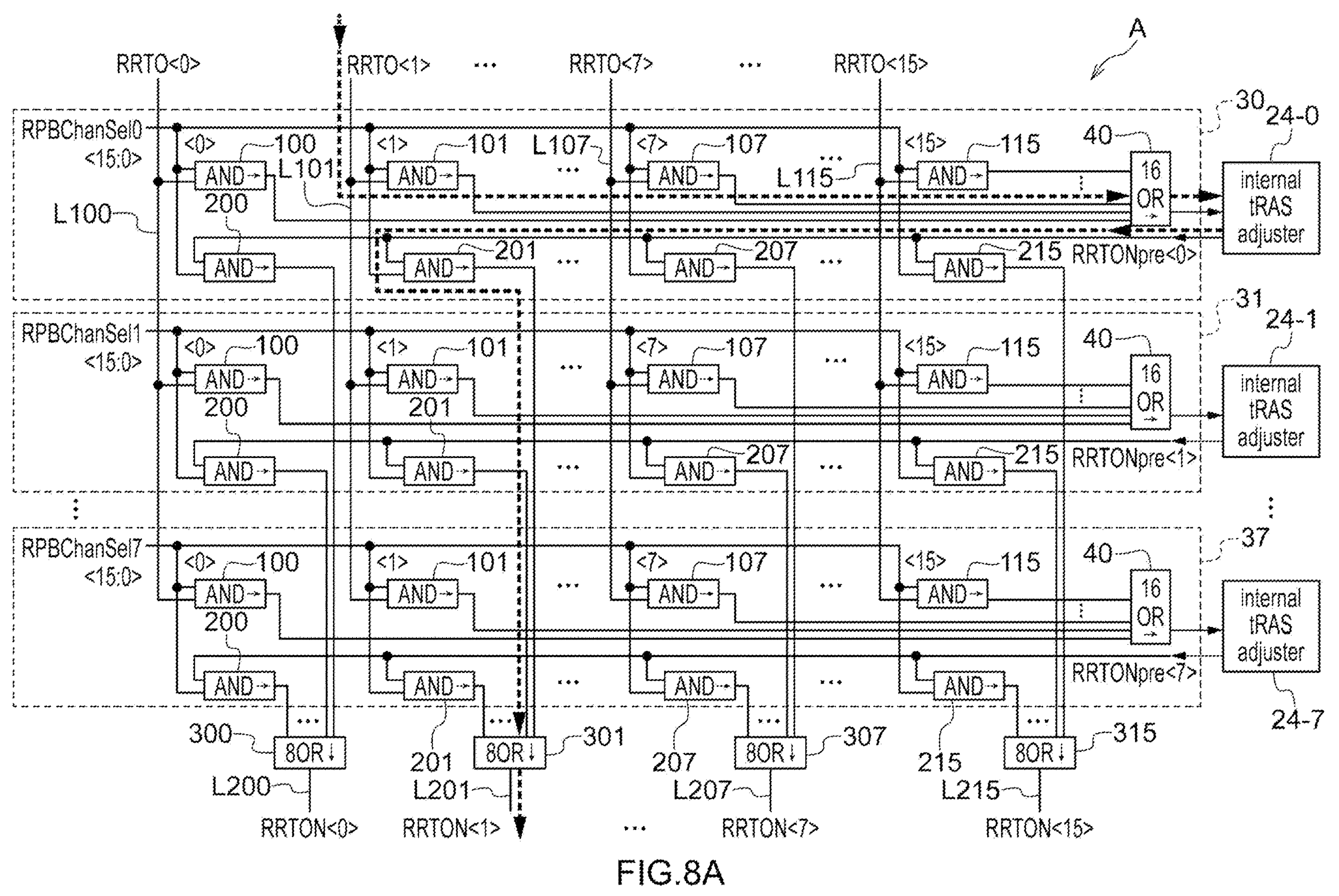
FIGS. 8A and 8B are explanatory diagrams of operations of the distribution circuit.
Figure 8B:
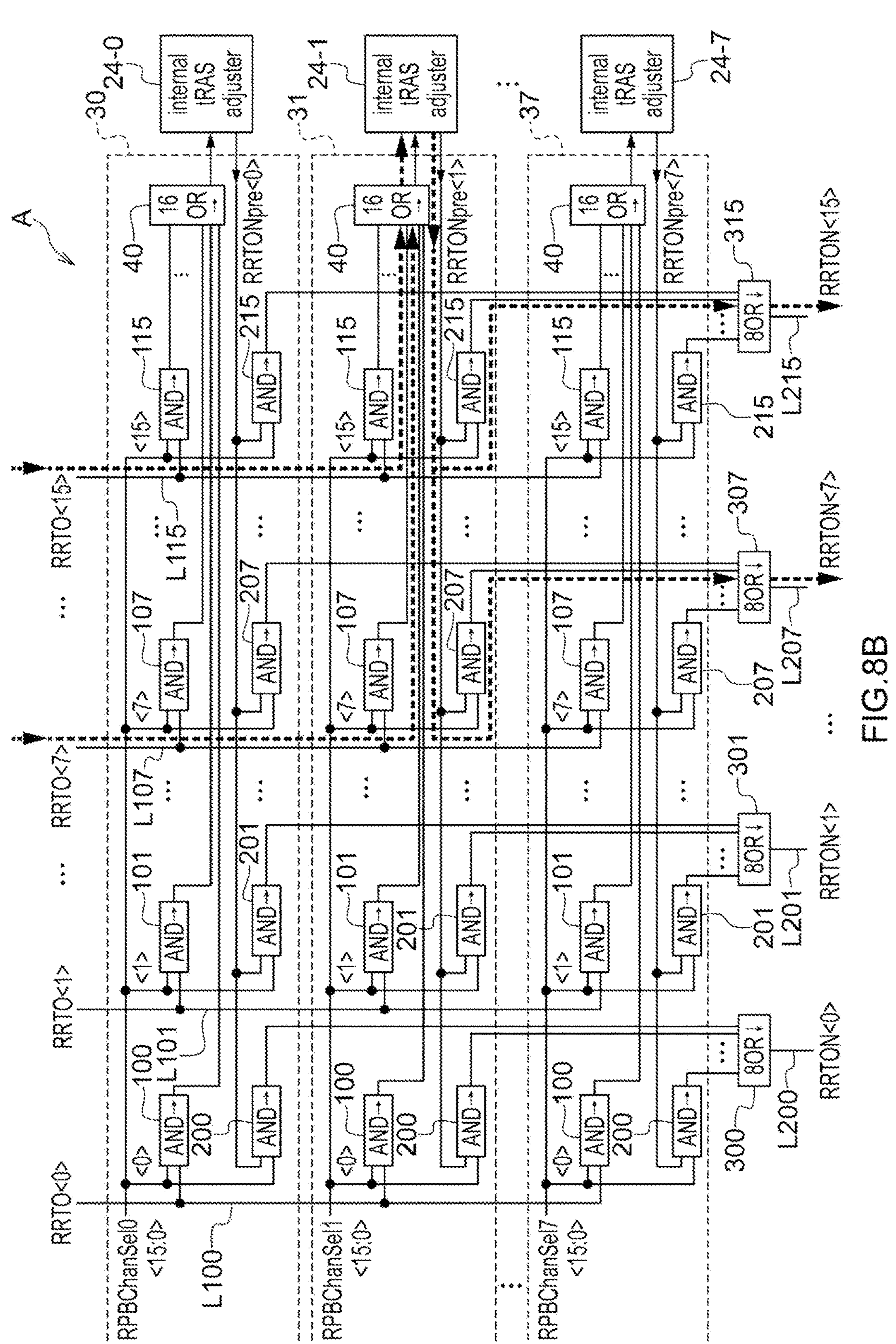

As an example, when a refresh management command DRFMpb specifying the memory bank MB1 is issued at a first timing, as shown in FIG. 8A, the selector circuit 30 is selected, for example, and the control signal RRTON<1> is generated from the control signal RRTO<1> using the internal tRAS adjuster 24-0 corresponding to the selector circuit 30. When a refresh command REFpb specifying the memory banks MB7 and MB15 is issued at a second timing, as shown in FIG. 8B, the selector circuit 31 is selected, for example, and the control signals RRTON<7> and <15> are generated from the control signals RRTO<7> and <15> using the internal tRAS adjuster 24-1 corresponding to the selector circuit 31. At this time, the control signal RRTO<7> having passed the input AND gate circuit 107 and the control signal RRTO<15> having passed the input AND gate circuit 115 are combined with each other by the OR gate circuit 40. Such combination is possible because a refresh operation on the memory bank MB7 and a refresh operation on the memory bank MB15 are performed concurrently. In this manner, in the present embodiment, the eight internal tRAS adjusters 24-0 to 24-7 are dynamically allocated to the sixteen memory banks MB0 to MB15, and thus the number of required internal tRAS adjusters 24-0 to 24-7 can be reduced.

Figure 9:
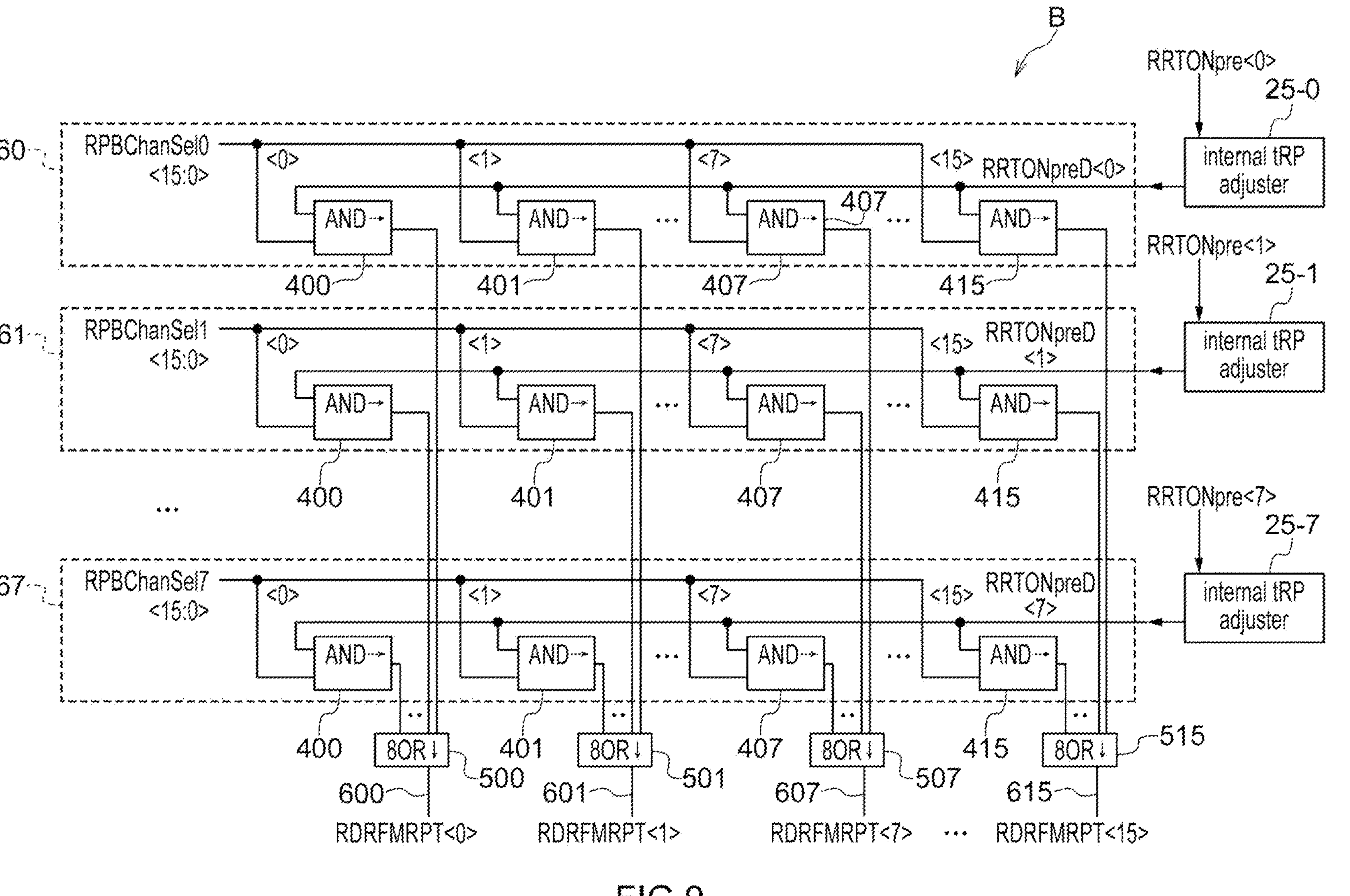
FIG. 9 is a circuit diagram of a distribution circuit connected to an internal tRP adjuster.

FIG. 9 is a circuit diagram of a distribution circuit B connected to a latter part of the internal tRP adjuster 25. As shown in FIG. 9, the distribution circuit B includes eight selector circuits 60 to 67. Each of the selector circuits 60 to 67 has a corresponding one of internal tRP adjusters 25-0 to 25-7 allocated thereto. That is, in the example shown in FIG. 9, eight internal tRP adjusters 25-0 to 25-7 are provided. Control signals RRTONpre<0> to <7> are respectively input to the eight internal tRP adjusters 25-0 to 25-7. The internal tRP adjusters 25-0 to 25-7 respectively cause a predetermined amount of delay to the input control signals RRTONpre<0> to <7> and output these signals as control signals RRTONpreD<0> to <7>. Each of the selector circuits 60 to 67 includes output AND gate circuits 400 to 415. Any one of the control signals RRTONpreD<0> to <7> is commonly supplied to one of input nodes of each of the output AND gate circuits 400 to 415 from corresponding internal tRP adjusters 25-0 to 25-7. The selection signals RPBChanSel<i><k> are respectively supplied to the other input node of each of the output AND gate circuits 400 to 415. Here, i is any one of 0 to 7 and the number is different in each of the selector circuits 60 to 67, and k is any one of 0 to 15 and the number corresponds to each of the output AND gate circuits 400 to 415.

An output signal from the output AND gate circuit 400 included in each of the selector circuits 60 to 67 is supplied to an OR gate circuit 500. That is, the OR gate circuit 500 is an OR circuit of 8-input type, and an output signal therefrom is a control signal RDRFMRPT<0>. Other OR gate circuits 501 to 515 have the same configuration, and the OR gate circuits 501 to 515 respectively generate control signals RDRFMRPT<1> to <15> based on output signals from the output AND gate circuits 401 to 415 respectively corresponding to the OR gate circuits 501 to 515. The control signals RDRFMRPT<0> to <15> are supplied to the refresh control circuit 22 shown in FIG. 1 via output lines L600 to L615, respectively. In this manner, in the present embodiment, the eight internal tRP adjusters 25-0 to 25-7 are dynamically allocated to the sixteen memory banks MB0 to MB15, and thus the number of required internal tRP adjusters 25-0 to 25-7 can be reduced.

Figure 10:
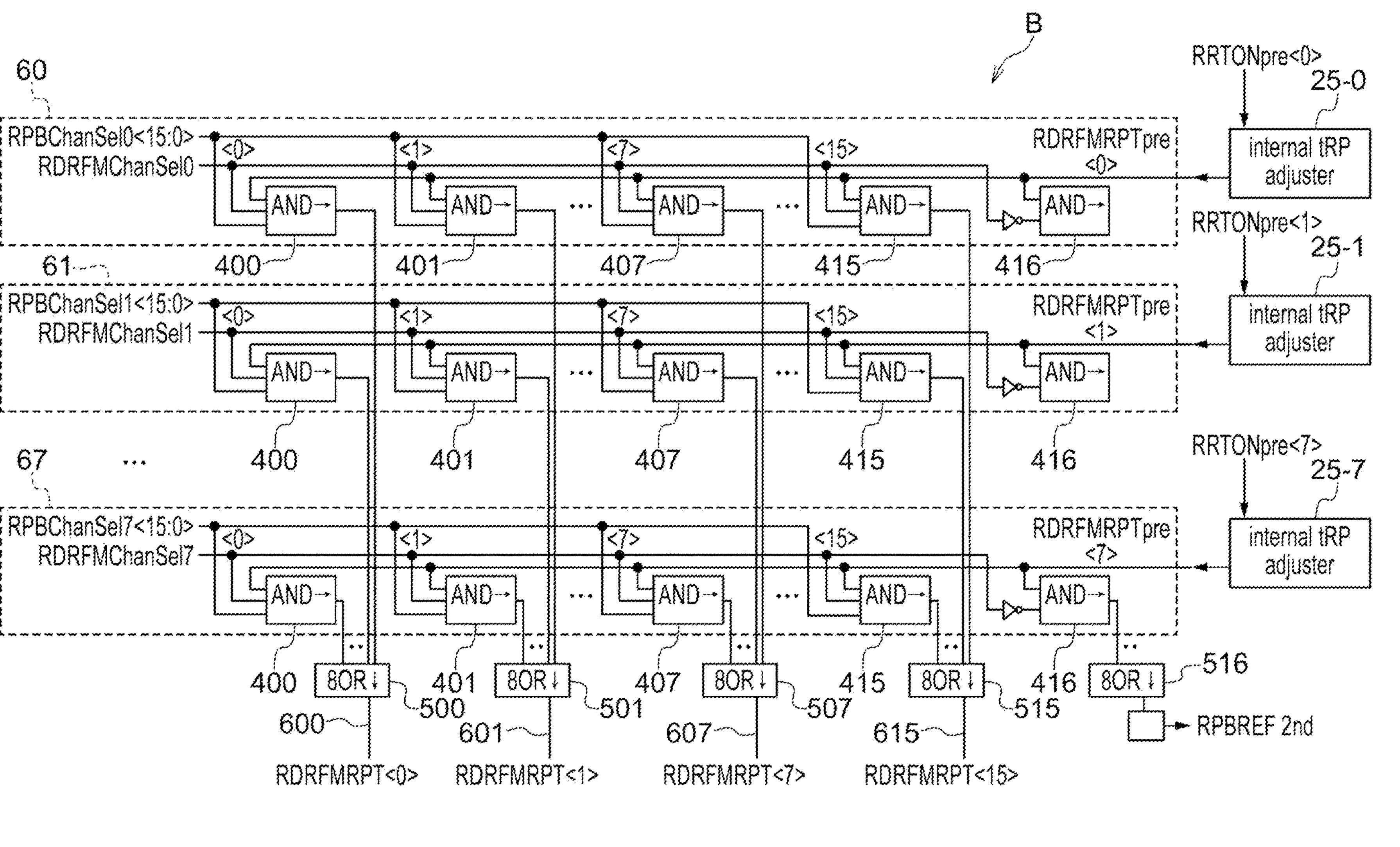
FIG. 10 is a circuit diagram of a distribution circuit according to a modification connected to an internal tRP adjuster.

FIG. 10 is a circuit diagram of a distribution circuit B according to a modification. In the example shown in FIG. 10, all the output AND gate circuits 400 to 415 included in the selector circuits 60 to 67 are circuits of 3-input type, and selection signals RDRFMChanSel0 to RDRFMChanSel7 respectively corresponding to the selector circuits 60 to 67 are further input thereto. The selection signals RDRFMChanSel0 to RDRFMChanSel7 are signals that become a high level when respectively corresponding internal tRP adjusters 25-0 to 25-7 are used for operations based on the refresh management command DRFMpb and that become a low level when respectively corresponding internal tRP adjusters 25-0 to 25-7 are used for operations based on the refresh command REFpb. Accordingly, the operations based on the refresh management command DRFMpb are the same as those of the circuits shown in FIG. 9. Meanwhile, in the operations based on the refresh command REFpb, all the output AND gate circuits 400 to 415 are deactivated and the output AND gate circuit 416 is activated. Accordingly, in the second and subsequent refresh operations based on the refresh command REFpb, information regarding bank addresses is ignored, and a control signal RPBREF2nd is generated via an OR gate circuit 516 instead of the control signals RDRFMRPT<0> to <15>. As shown in FIG. 1, the control signal RPBREF2nd is used instead of the control signals RDRFMRPT<0> to <15>.

Figure 11:
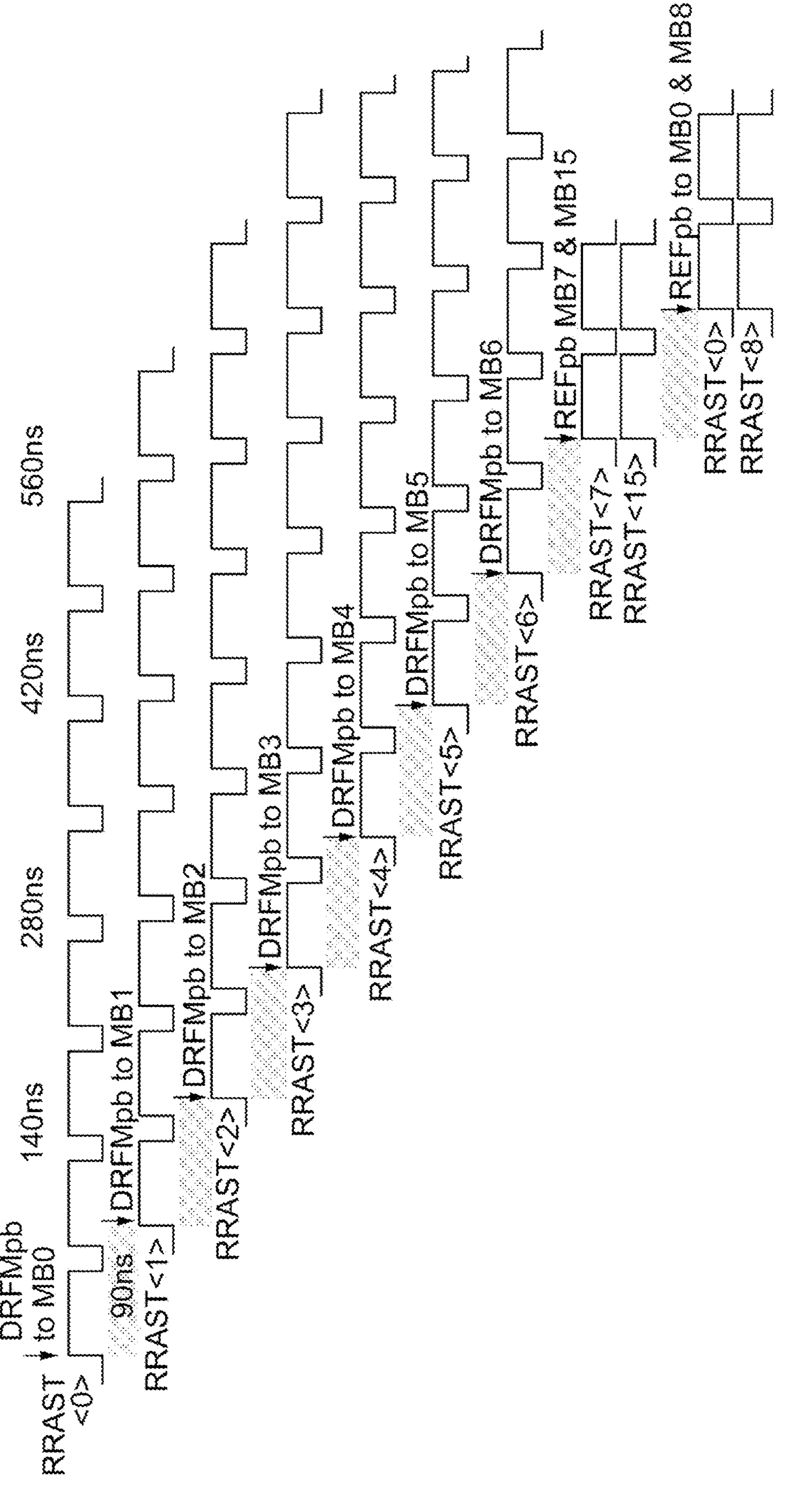
FIG. 11 is a timing chart for explaining an example of operations when a refresh management command and a refresh command are issued successively.

FIG. 11 is a timing chart for explaining an example of operations when the refresh management command DRFMpb and the refresh command REFpb are issued successively. The example shown in FIG. 11 represents a state where a refresh management command DRFMpb having specified the memory banks MB0 to MB6 is issued successively, then a refresh command REFpb having specified the memory banks MB7 and MB15 is issued, and then a refresh command REFpb having specified the memory banks MB0 and MB8 is issued. The minimum issuing interval of the refresh management command DRFMpb or the refresh command REFpb corresponding to different memory banks is 90 ns, for example. In the example shown in FIG. 11, in response to one issuance of the refresh management command DRFMpb, a corresponding active signal RRAST is activated eight times. The eight word lines refreshed in this operation are word lines WL−4, WL−3, WL−2, WL−1, WL+1, WL+2, WL+3, and WL+4 shown in FIG. 3, for example. When it is assumed that the time required for one refresh operation is 70 ns, 560 ns (=70 ns×8) at maximum is required to complete an operation responding to one issuance of the refresh management command DRFMpb. In addition, when it is assumed that the minimum issuing interval of the refresh management command DRFMpb or the refresh command REFpb corresponding to different memory banks is 90 ns, it suffices that at least seven internal tRAS adjusters 24 as well as seven internal tRP adjusters 25 are prepared.

Further, as shown in FIG. 11, when the refresh command REFpb is issued, the corresponding active signal RRAST is activated two times. Here, at the second activation of the active signal RRAST responsive to the refresh command REFpb, other memory banks are always in a deactivated state. Accordingly, as in the modification shown in FIG. 10, the active signal RRAST at the second activation can be activated using a single control signal RPBREF2nd instead of the control signals RDRFMRPT<0> to <15>.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
- a plurality of input signal lines respectively paired with a plurality of output signal lines;
- a plurality of first delay circuits operatively connected between the plurality of input signal lines and the plurality of output signal lines; and
- a first selector circuit configured to connect a selected one of the plurality of first delay circuits between a selected one of the plurality of input signal lines and a respective one of the plurality of output signal lines,
- wherein a number of the plurality of first delay circuits is less than a number of the plurality of input signal lines,
- wherein the first selector circuit is configured to select one of the plurality of first delay circuits responsive to a first selection signal and select one of the plurality of input signal lines and the respective one of the plurality of output signal lines responsive to a second selection signal,
- wherein the first selection signal is updated each time a predetermined command is issued from outside, and
- wherein the predetermined command includes a refresh command and a refresh management command.

2. The apparatus of claim 1, wherein the second selection signal is decided by a bank address supplied with the refresh command or the refresh management command.

3. The apparatus of claim 2, further comprising a plurality of memory banks corresponding to the plurality of input signal lines, respectively,
- wherein each of the plurality of memory banks is configured to supply a first timing signal to an associated one of the plurality of input signal lines before a refresh operation is finished.

4. The apparatus of claim 3, wherein each of the plurality of first delay circuits generates a second timing signal by delaying the first timing signal.

5. The apparatus of claim 4, wherein each of the memory banks is configured to perform a precharge operation responsive to the second timing signal output from an associated one of the plurality of output signal lines.

6. The apparatus of claim 5, further comprising:
- a plurality of first signal lines corresponding to the plurality of memory banks;
- a plurality of second delay circuits operatively connected between the plurality of first delay circuits and the plurality of first signal lines; and
- a second selector circuit configured to connect one of the plurality of second delay circuits between selected one of the plurality of first delay circuits and selected one of the plurality of first signal lines.

7. The apparatus of claim 6, wherein each of the plurality of second delay circuits generates a third timing signal by delaying the second timing signal.

8. The apparatus of claim 7, wherein each of the memory banks is configured to restart the refresh operation responsive to the third timing signal output from an associated one of the plurality of first signal lines.

9. The apparatus of claim 1,
- wherein the first selector circuit is configured to connect a first one of the plurality of first delay circuits between a first one of the plurality of input signal lines and a respective first one of the plurality of output signal lines in a first operation timing, and
- wherein the first selector circuit is configured to connect the first one of the plurality of first delay circuits between a second one of the plurality of input signal lines and a respective second one of the plurality of output signal lines in a second operation timing.

10. The apparatus of claim 9, wherein the first selector circuit is configured to connect a second one of the plurality of first delay circuits between the first one of the plurality of input signal lines and the respective first one of the plurality of output signal lines in a third operation timing.

11. The apparatus of claim 1, wherein a connection relation between the plurality of first delay circuits and the plurality of input signal lines is dynamically changed responsive to a selection signal.

12. An apparatus comprising:
- a plurality of selector circuits;
- a plurality of delay circuits corresponding to the plurality of selector circuits, respectively; and
- a plurality of first OR gate circuits,
- wherein each of the plurality of selector circuits includes:
  - a plurality of input gate circuits exclusively selected and each supplied with an associated one of a plurality of first control signals;
  - a second OR gate circuit supplied with output signals of the plurality of input gate circuits to generate a second control signal; and
  - a plurality of output gate circuits exclusively selected and supplied in common with a third control signal,
- wherein each of the plurality of delay circuits is configured to generate the third control signal responsive to the second control signal, and wherein each of the plurality of first OR gate circuits is supplied with output signals of the output gate circuits included in different ones of the plurality of selector circuits.

13. The apparatus of claim 12, wherein a number of the plurality of delay circuits is less than a number of the plurality of first OR gate circuits.

14. The apparatus of claim 12, wherein one of the plurality of selector circuits is configured to be selected.

15. The apparatus of claim 12, wherein the plurality of first control signals is exclusively activated.

16. An apparatus comprising:

a plurality of memory banks; and a center circuit including a plurality of timing adjusters, wherein the center circuit is configured to control a selected one of the plurality of memory banks so as to start performing a refresh operation responsive to an external command, wherein each of the plurality of memory banks is configured to activate a first control signal at a predetermined timing during the refresh operation, wherein the center circuit is configured to generate a second control signal by sending the first control signal to one of the plurality of timing adjusters, wherein each of the plurality of memory banks is configured to start performing a precharge operation responsive to the second control signal, wherein a connection relation between the plurality of memory banks and the plurality of timing adjusters is dynamically changed responsive to a third control signal, and wherein the third control signal is updated responsive to the external command.

* * * * *